(12) United States Patent
Lobbins

(10) Patent No.: US 6,593,151 B1
(45) Date of Patent: Jul. 15, 2003

(54) METHOD FOR REGULAR DETECTION OF PHOSPHORUS STRIATIONS IN A MULTI-LAYERED FILM STACK

(75) Inventor: Jonathan M. Lobbins, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/604,020

(22) Filed: Jun. 26, 2000

(51) Int. Cl.[7] .............................................. H01L 21/66
(52) U.S. Cl. ........................................ 438/14; 438/783
(58) Field of Search ........................... 438/14, 253, 653

(56) References Cited

U.S. PATENT DOCUMENTS

| | | | |
|---|---|---|---|
| 5,795,811 A | * | 8/1998 | Kim et al. .................. 438/404 |
| 5,932,929 A | * | 8/1999 | Lui et al. .................... 257/763 |
| 6,335,279 B2 | * | 1/2002 | Jung et al. ................. 438/666 |
| 6,342,419 B1 | * | 1/2002 | Tu ............................... 438/253 |

* cited by examiner

Primary Examiner—David Nelms
Assistant Examiner—Thao P Le
(74) Attorney, Agent, or Firm—Christie, Parker & Hale, LLP

(57) ABSTRACT

A new control wafer configuration and method allows for the earlier detection of processing problems and resulting striations, localized high concentrations of phosphorous, in product wafers as compared to the standard control wafer configuration currently being used. By increasing the thickness of a phosphorus doped silicate glass (PSG) layer in a film stack from about 1500 Å in the standard control wafer to a thickness greater than about 2500 Å, preferably a thickness in the range between about 3000 Å to about 4000 Å, any localized high concentration phosphorus striations are consistently found within the PSG layer during testing. As a result, the PSG layer in the control wafer accurately represents potential defects in the product wafers. If there is a problem on the production line, the striations are detected in the control wafer before mass production of product wafers continues.

10 Claims, 7 Drawing Sheets

CLEAN STRIATION CHECK WAFER

SINGLE HEAVY STRIATION-USUALLY FROM CLOGGED TEPO INJECTOR

CLEAN PRODUCT WAFER

SINGLE STRIATION EFFECTS ON PRODUCT

METHOD FOR REGULAR DETECTION OF PHOSPHORUS STRIATIONS IN A MULTI-LAYERED FILM STACK

FIELD OF THE INVENTION

The invention pertains to the field of semiconductor fabrication. More particularly, the invention pertains to the detection and monitoring of striations in multi-layer film stacks.

BACKGROUND OF THE INVENTION

Hundreds of processing steps, known to those skilled in the art, are typically required to fabricate integrated circuits on semiconductor substrates. The integrated circuits are created from multiple layers of various materials, semiconductors, oxides and metals, which are deposited onto thin disks of purified crystalline semiconductor substrate material, typically silicon, germanium, gallium arsenide or other materials known to those skilled in the art. These multiple layer film stacks are called wafers. After, processing, wafers are divided into separate chips.

The oxide or dielectric layers are used as insulation between conducting layers, as well as a source of dopants for diffusion, getters for impurities and passivation to protect devices against impurities, moisture and physical damage. Dielectric materials typically are used as multi-layered film stacks containing films varying in structure or composition. Commonly used dielectric materials include phosphorous-doped silicon dioxide or phosphorous silicate glass ("PSG") and boron phosphorus silicate glass ("BPSG").

One type of defect that is especially prevalent in phosphorous-doped oxide layers in multi-layer film stacks is a striation. Striations are localized areas with high concentrations of phosphorus which can not effectively be removed during further processing and are fatal to the product wafers. Striations are formed during deposition of the oxide layer as a result of processing problems, such as when one or more liquid phosphorus injector(s) on the production line become clogged or when condensation and vaporization occur due to cold spots in the line during chemical vapor deposition.

During processing of product wafers, oxides that are used as insulators between conducting layers are deposited and then etched to open windows for electrical connections, and oxides that are used as passivation for devices are etched to open areas for bonding. A fluoride containing solution or plasma, such as a hydrofluoric acid solution or a $CHF_3$ plasma, is used to etch the oxide. However, the rate of etching is phosphorous-dependent such that areas with higher phosphorous concentrations etch more rapidly than areas with lower phosphorous concentrations. An example of the deleterious effects of striations follows. A window is cut into the product wafer so that all of the layers are exposed, after which the fluoride containing etch is performed. The striations are etched at a higher rate than other areas of the product wafer, leaving a void or crack in the oxide layer. When metal is later added to the product wafer during further processing, the metal fills the hole created by the striation, negating the insulating properties of the oxide layer and breaking the current running through the product wafer, thereby effectively destroying the product wafer. Accordingly, product wafers containing striations can be detected during electrical testing of finished wafers and such product wafers are scrapped.

In large-scale production of integrated circuit devices, control wafers are used to detect defects which occur during the manufacturing process. Control wafers are generally used to check for film composition, film structure and film contaminants. Control wafers are processed separately from product wafers, typically prior to running product wafers and at regular intervals during the fabrication of product wafers. The control wafers are destructively evaluated to detect defects in the film layer stacks prior to additional production of product wafers. Using specialized control wafers as test wafers facilitates the early detection of processing problems and prevents the need to scrap entire production lines of product wafers.

Striations can only be detected in the layered oxide film stack by using destructive analytical techniques. Even if processing is interrupted to analyze the freshly deposited oxide film for striations, there is no technique available that will allow the detection of localized concentrations of phosphorous throughout the film thickness without sectioning the wafer or "burning" a hole into the wafer. For example, x-ray fluorescence spectrometry (XRF), a metrology tool which is utilized on the production line, will only detect the phosphorus levels vertically down through the entire wafer by averaging the amount of phosphorus it detects throughout the total thickness of the wafer. XRF is, therefore, incapable of reliably detecting localized areas of phosphorus. Since the localized concentrations of phosphorous may only be detected using destructive techniques, control wafers are used for the detection of striations rather than destroying product wafers.

Scanning electron microscopy (SEM) and secondary ion mass spectroscopy (SIMS) are alternate methods for the detection of striations in control wafers which each require the wafer to be taken off the production line for testing. For SEM analysis, the control wafer is cross-sectioned and then etched with a fluoride containing etch. Areas with higher concentrations of phosphorous etch faster than other areas, creating voids or cracks so that the striations appear as dark areas in the SEM. SIMS functions by sending an oxygen beam through the thickness of the control wafer to dislodge atoms from the material by collision with the oxygen beam, and a detector identifies what material is at each depth of the control wafer. SIMS produces a profile of the phosphorous concentration throughout the thickness of the control wafer.

Typically, control wafers are made using the same equipment and processes that are used for making the product wafers in order to simulate the product wafers. The current method of detecting striations includes a standard production recipe for a control wafer. The standard configuration for a control wafer (5) is depicted in FIG. 1. There are four layers: a substrate layer (2), usually made of silicon, germanium, gallium arsenide or other materials known to those skilled in the art, and three additional layers that mimic the product: an undoped silicate glass (USG) layer (4), a PSG layer (6), and a BPSG layer (8). Layers (4), (6), and (8) of the control wafer (5) are generally found as intermediate layers in product wafers.

Preferably, the total thickness of the control wafer (5) is approximately the same as a finished product wafer, in order to make the control wafer (5) more representative of the product wafer. In the control wafer (5) known in the prior art, the thickness of the three silicate glass layers follows a standard recipe. The substrate layer (2), which may vary in thickness, is not discussed here. Typically, the USG layer (4) in FIG. 1 has a thickness of about 1000 Å, the PSG layer (6) has a thickness of about 1500 Å, and the uppermost layer, BPSG (8) varies depending on the production line and the thickness of the layers on the particular product wafers, but typically has a thickness of about 6000 Å. The thickness of the PSG layer (6) on the control wafer (5) was chosen to mimic the thickness of the PSG layer on the product wafer which typically has a thickness of 1500 Å for maximum ability to getter or trap sodium impurities.

In the control wafer (5), the substrate layer (2), the USG layer (4) and the BPSG layer (8) are non-essential, that is, they have no function in the detection of striations in the control wafers. The PSG layer (6) is a phosphorous-doped oxide layer in the control wafer (5). The striations are observed in the BPSG layer. When there is a problem with the hardware on the production line during chemical vapor deposition of the PSG layer (6), striations may be produced in the PSG layer (6) and the BPSG layer (8) of both the control wafer (5) and product wafers.

The standard control wafer (5) configuration, however, does not consistently detect striations that occur within the product wafers during processing. By inspecting etched, cross-sectioned wafers using scanning electron microscopy (SEM) for the current invention, striations have been observed to occur at varying thickness levels of the PSG layer, however, the average frequency of a striation has been observed to occur at approximately 2500 Å. This number is only an average, and therefore striations may occur over a large range. In fact, the range can be from 1 Å to infinite, but the striations usually range from about 2000 Å–about 3000 Å. Since the average frequency of a striation is about every 2500 Å, however, it is unlikely that each individual control wafer (5) will definitely contain a striation when there is a processing problem, thus making the control wafer (5) ineffective at positively detecting when striations may occur in the product wafers on the production line.

If, for example, a certain striation has the potential to occur at about 2500 Å, the control wafer (5) with only a 1500 Å thick PSG layer (6) would not contain the striation. Although the liquid phosphorus injectors are clogged or there is another hardware processing problem resulting in uneven concentrations of phosphorous in the PSG layer (6), the striation "skips" the PSG layer (6) in the control wafer (5) because the PSG layer (6) is too thin to consistently contain the striation within the PSG layer (6). Therefore, when the control wafer (5) is tested for striations prior to or during mass production of the product wafers, a striation is not detected. Consequently, potential processing problems on the production line which can cause striations in the product wafers are not accurately represented by the control wafer (5).

Since the PSG layer (6) in the control wafer (5) is too thin to consistently contain striations, many of the control wafers are defect-free, while the product wafers contain striations. Thousands of product wafers are processed, thereby resulting in striations in at least some of the product wafers. However, the defect is overlooked and the product wafers continue through additional processing. The product wafers are tested just prior to shipment. At this time, final testing steps are performed to see if current passes through the product wafer. As discussed above, product wafers containing a striation do not effectively pass current. Typically, if a striation is found within a lot of product wafers, the entire lot must be scrapped due to future reliability concerns, wasting both time and money.

Product wafers continue to be scrapped due to the inability to regularly detect and monitor striations in multi-layer film stacks using conventional control wafers. There is a need for a better, earlier and more reliable method of detection in order to make the production of product wafers more cost effective.

SUMMARY OF THE INVENTION

Briefly stated, a new control wafer configuration and method allow for more reliable and earlier detection of striations, and the early correction of the processing problems that cause the striations. By modifying the standard control wafer recipe currently being used, processing problems are more likely to be detected prior to processing additional product wafers and prior to further processing of any defective product wafers. By increasing the thickness of the PSG layer in a film stack from about 1500 Å in the standard control wafer recipe to a thickness greater than about 2500 Å, preferably a range between about 3000 Å to about 4000 Å, processing problems resulting in high-localized phosphorus striations are consistently detected within the PSG layer during destructive testing of the control wafer. As a result, the PSG layer in the control wafer more accurately predicts potential defects in the product wafers. If there is a problem on the production line, the striations are detected in the control wafer before mass production of product wafers continues. Accordingly, the processing facility can be shut down to repair the processing problem before additional product wafers are produced and defective wafers do not undergo further processing, thus reducing scrap and saving additional processing time and money.

In an embodiment of the invention, a control wafer to test for striations includes a substrate layer, an USG layer deposited directly on top of the substrate layer, a PSG layer having a thickness greater than about 2500 Å, preferably from about 3000 Å to about 4000 Å deposited directly on top of the USG layer, and a BPSG layer deposited directly on top of the PSG layer wherein a total thickness of the control wafer is equivalent to the total thickness of a product wafer.

In another embodiment of the invention, a method of detecting a striation in a control wafer for a multi-layer film stack includes (a) producing a control wafer wherein the control wafer comprises a substrate layer, an USG layer deposited directly onto the substrate layer, a PSG layer having a thickness greater than about 2500 Å, preferably from about 3000 Å to about 4000 Å deposited directly on top of the USG layer, and a BPSG layer deposited directly on top of the PSG layer wherein a total thickness of the control wafer is equivalent to a total thickness of a product wafer, and (b) analyzing the control wafer to detect any striations.

DETAILED DESCRIPTION OF THE PREFERRED EMBODIMENTS

Figure 1:
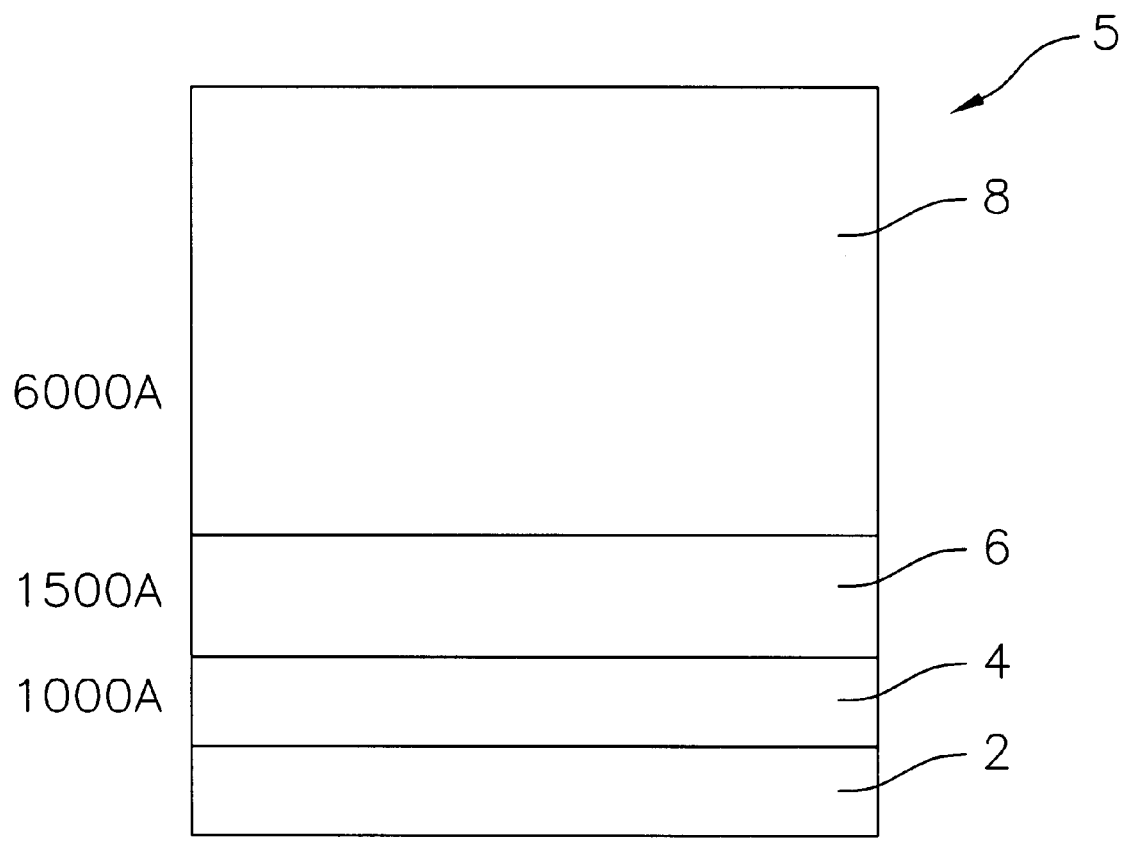
FIG. 1 shows a prior art standard control wafer configuration.
Figure 2:
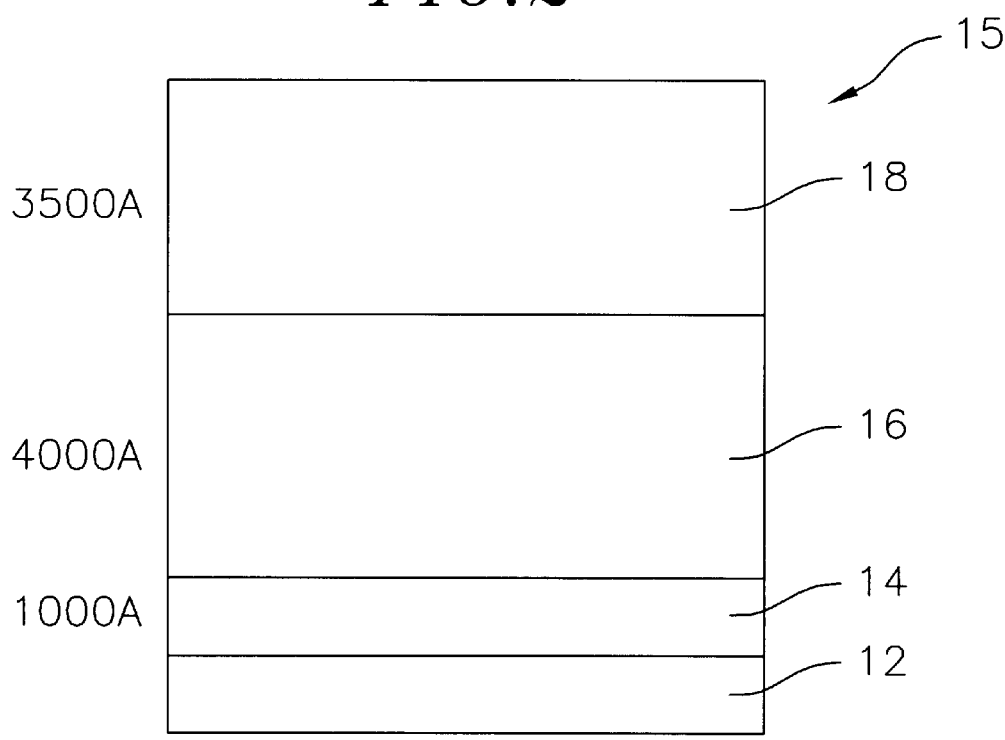
FIG. 2 shows a control wafer configuration according to an embodiment of the current invention.

Referring to FIG. 2, a new configuration for a control wafer (15) contains the same four types of layers deposited in the same order as the product wafers to mimic the product wafers: a substrate layer (12), made of semiconductor material, such as silicon, germanium, gallium arsenide or other materials known to those skilled in the art, an USG layer (14) on top of the substrate layer (12), a PSG layer (16) on top of the USG layer (14), and a BPSG layer (18) on top of the USG layer (14). However, the thickness of the layers in the control wafer (15) are substantially different than the thickness of the layers in the prior art control wafer configuration. Specifically, the PSG layer (16) in FIG. 2 is thicker than the PSG layer (6) in the prior art control wafer configuration of FIG. 1. The thickness of the PSG layer (16) is selected for more reliable detection of striations. When there is a processing problem resulting in localized high phosphorous concentrations, a striation is formed approximately every 2500 Å. Accordingly, the thickness of the PSG layer (16) of the control wafer (15) is greater than about 2500 Å, preferably in the range of about 3000 Å to about 4000 Å thick. The thicker PSG layer (16) consistently contains any striations formed as a result of processing problems. Striations no longer "skip" the PSG layer (16) as they could skip the thinner 1500 Å PSG layer (6) of the prior art control wafer configuration.

The total thickness of the film stack on the control wafer (15) is equivalent to the thickness of the film stack on the product wafers being produced so that the control wafer (15) is representative of the product wafers. Additionally, if SIMS will be used to analyze the control wafer for striations, then the total film stack thickness should be less than the detection limit for SIMS, typically about 10,000 Å, to allow SIMS to sputter through the film stack and detect the phosphorous levels throughout the entire thickness of the film stack. To keep the total thickness of the film stack constant while compensating for the increased thickness of the PSG layer (16), the thickness of one or both of the other layers, the USG layer (14) and/or the BPSG layer (18), is decreased. The thickness of the USG layer (14) and the BPSG layer (18) can be varied while maintaining the total film stack thickness. The deposition parameters for each layer are adjusted to achieve the desired thickness of the resultant layer. By decreasing the thickness of the resultant USG layer (14) and/or the BPSG layer (18), the total film stack thickness within SIMS detection limits is ensured.

Figure 3:
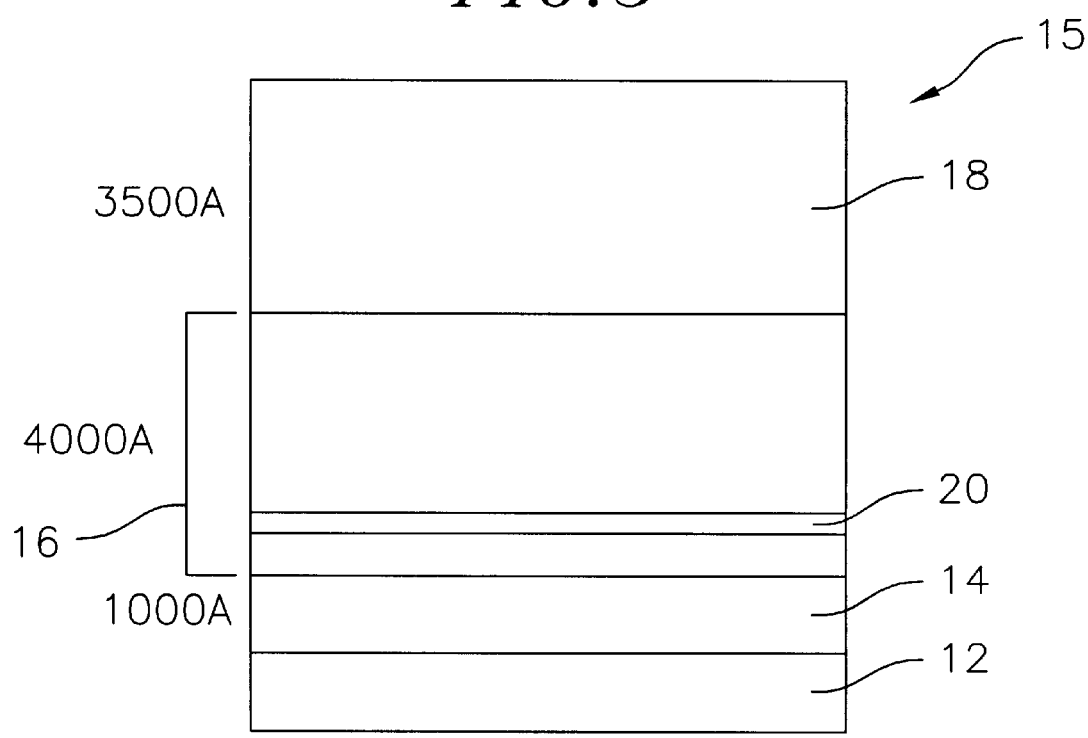
FIG. 3 shows the presence of a striation in the control wafer configuration of FIG. 2.

Referring to FIG. 3, a striation (20) is shown in the control wafer (15). Even if the striation (20) occurs at about 2500 Å, the PSG layer (16) of the control wafer (15) contains the striation (20), whereas the PSG layer (6) of the control wafer (5) in FIG. 1 would not contain a striation despite a processing problem which could produce striations in the product wafers. Therefore, the control wafer (15) is a more effective and reliable detector of processing problems and striations that result in scrapped product wafers.

Figure 4:
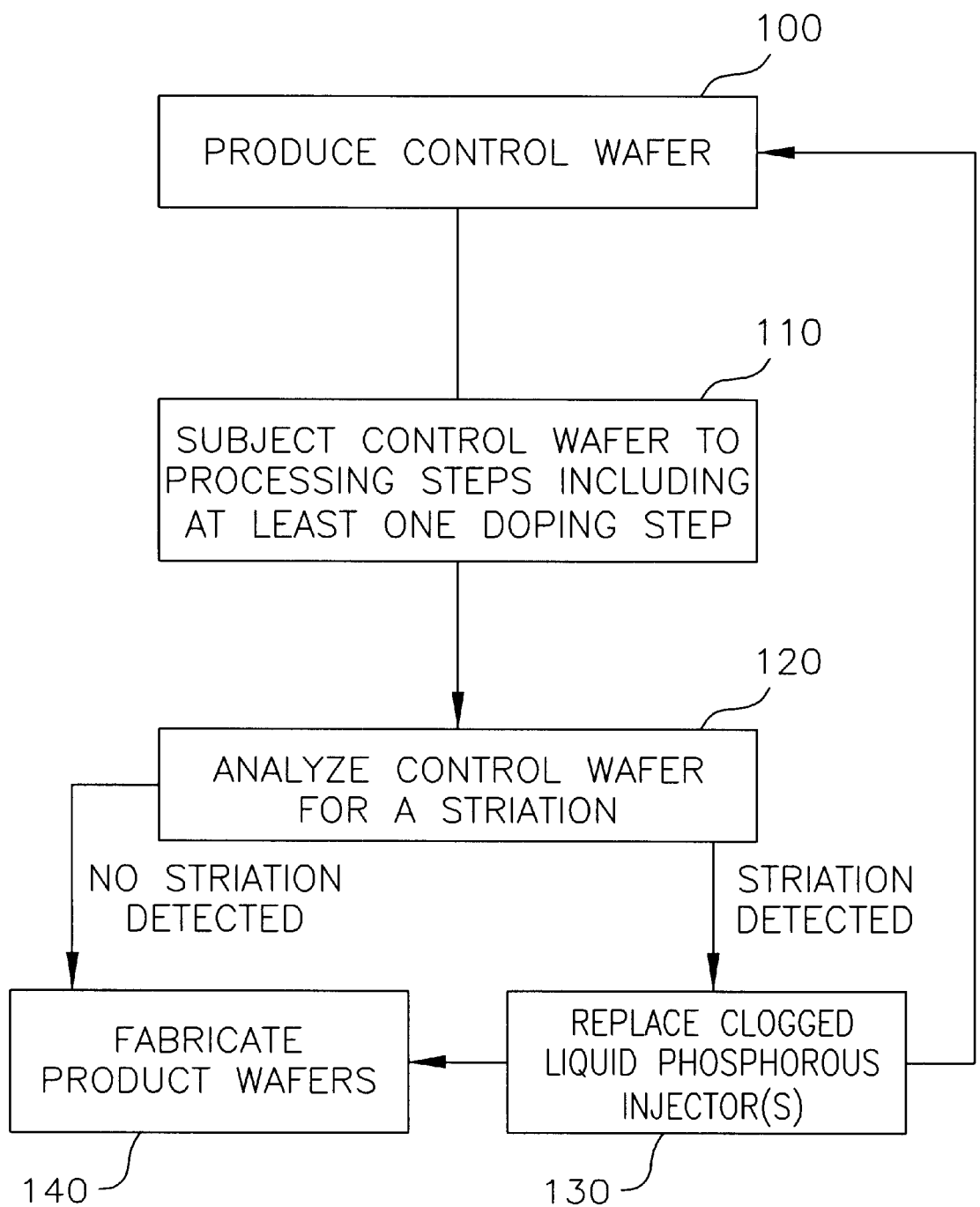
FIG. 4 shows a flow chart of an embodiment of the method of the current invention.

Referring to FIG. 4, an embodiment of the method of the current invention begins by producing a control wafer (15) as depicted in FIG. 2 in step (100). The PSG layer (16) is greater than about 2500 Å, preferably in the range of about 3000 Å to about 4000 Å thick. A preferred embodiment of the current invention has a PSG layer of about 4000 Å thick. The total thickness of the control wafer (15) is preferably equivalent to the thickness of the product wafer but need only be limited to the detection limit of SIMS if SIMS, rather than SEM, will be used to destructively evaluate the control wafer (15). To produce the control wafer (15) in step (100), the substrate is subjected to multiple processing steps to deposit the USG layer (14), the PSG layer (16) and the BPSG layer(18). These processing steps are the same processing steps used to fabricate product wafers. The only difference is that the thickness of the layers on the control wafer (15) is different from the thickness of the layers on product wafers. By increasing the thickness of the PSG layer (16) of the control wafer (15), periodic striations are more accurately detected than with the prior art control wafer (5) of FIG. 1. The thicker PSG layer (16) consistently contains any striations formed during processing, since a striation is found approximately every 2500 Å when there are processing problems during deposition of the PSG layer (16). In the control wafer (15) of the current invention, a striation at this frequency falls within the PSG layer (16); thus the striation is detected easily using the present method.

Figure 5A:
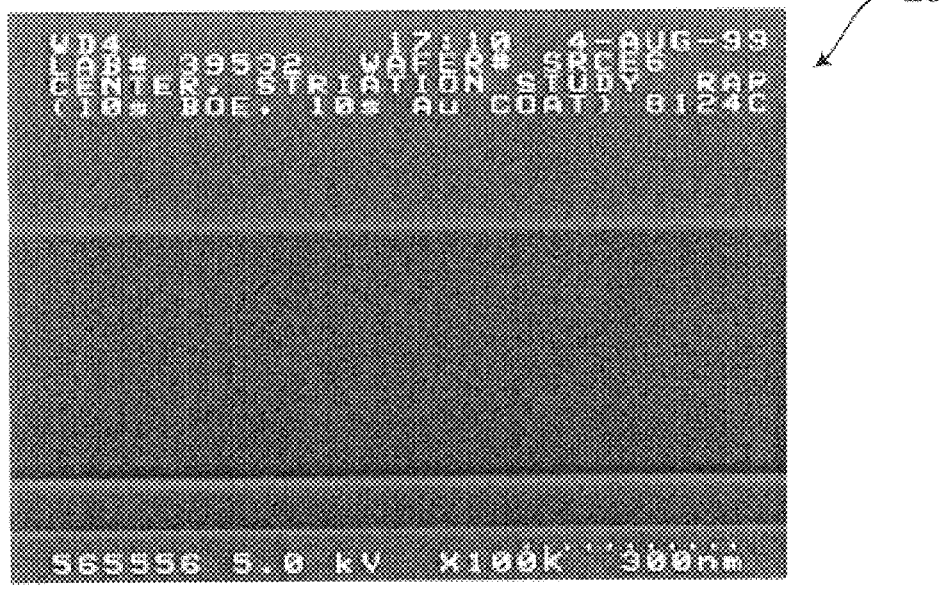
FIG. 5A shows a SEM image of a control wafer void of striations.
Figure 5B:
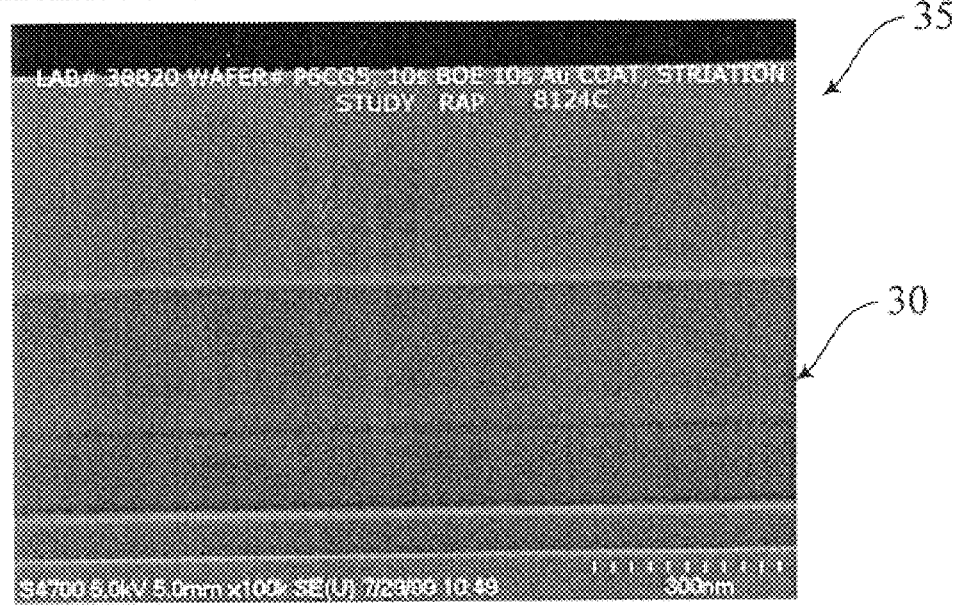
FIG. 5B shows a SEM image of a control wafer containing a striation.
Figure 6A:
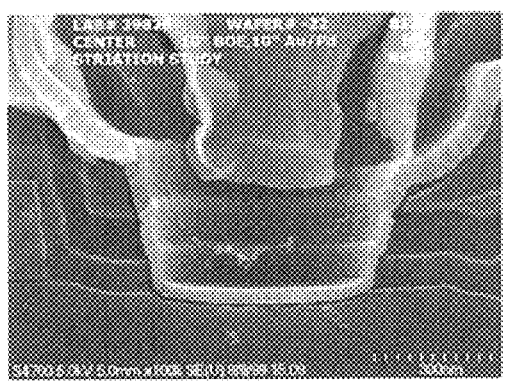
FIG. 6A shows a SEM image of a product wafer void of striations.
Figure 6B:
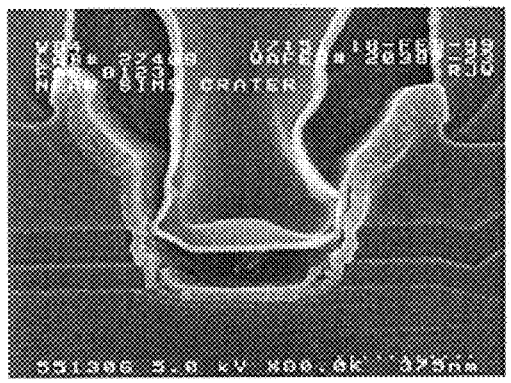
FIG. 6B shows a SEM image of a product wafer containing a single striation.
Figure 6C:
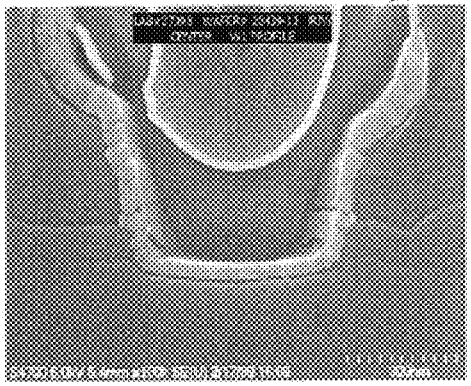
FIG. 6C shows a SEM image of a product wafer containing a single striation.

The control wafer (15) is analyzed to detect striations in step (120). The preferred analysis technique is SEM or SIMS. For SEM analysis, the control wafer (15) is cross-sectioned and etched with a fluoride containing etch. The etch is phosphorous-dependent such that it removes material containing high concentrations of phosphorous at a faster rate than material containing lower concentrations of phosphorous. Accordingly, the etch leaves a void or depression at the site of localized high phosphorous concentrations, so that striations appear as dark lines when observed in the SEM. A SEM image of a control wafer (25) without any striations is shown in FIG. 5A and a SEM image of a control wafer (35) containing a striation (30) is shown in FIG. 5B. Referring also to FIG. 6A through 6C, SEM images of both a clean product wafer (45) (FIG. 6A), and product wafers (55, 65) containing striations (70) (FIG. 6B and FIG. 6C) are shown.

Figure 7A:
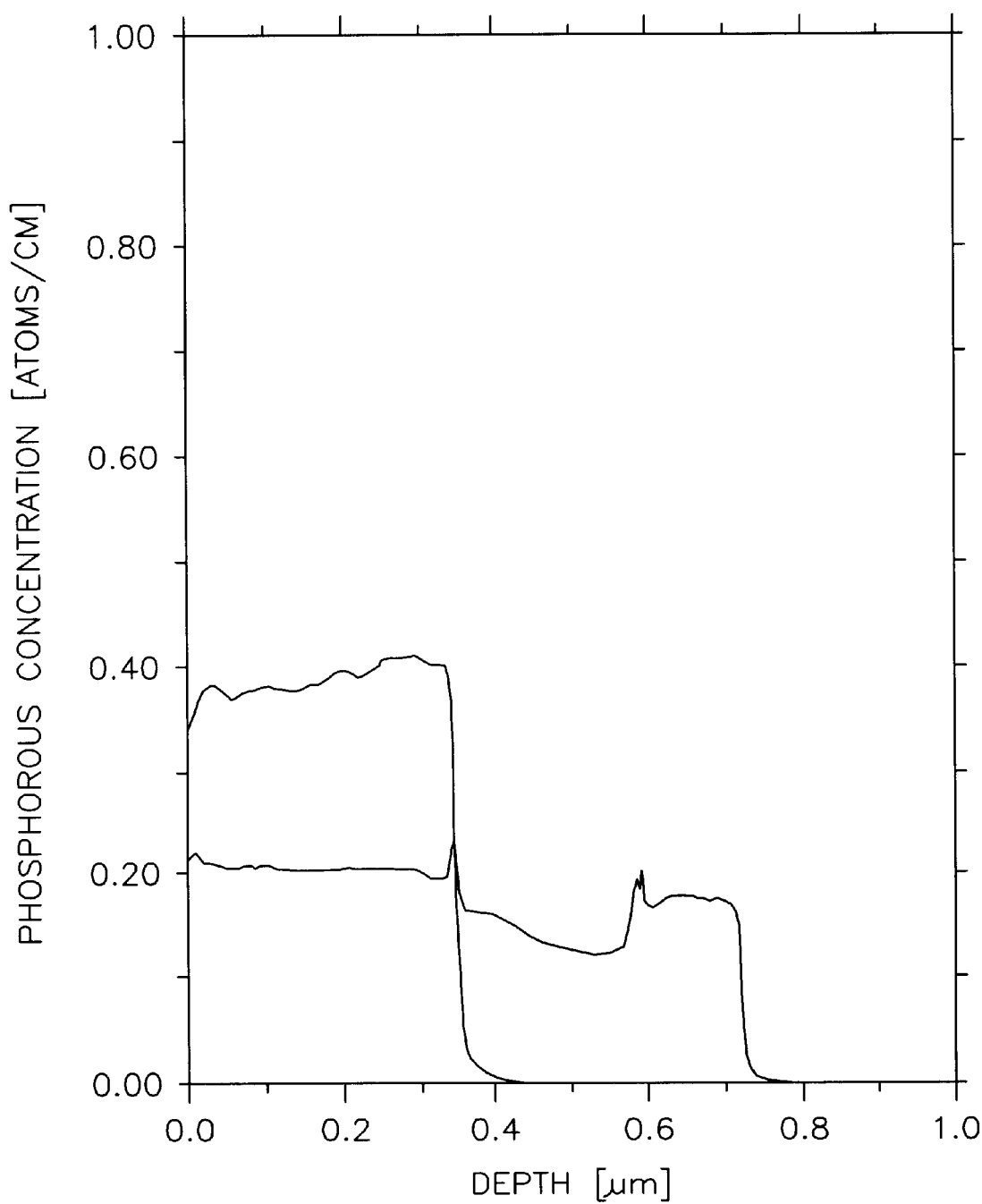
FIG. 7A shows a SIMS profile of a control wafer with a constant phosphorous concentration.
Figure 7B:
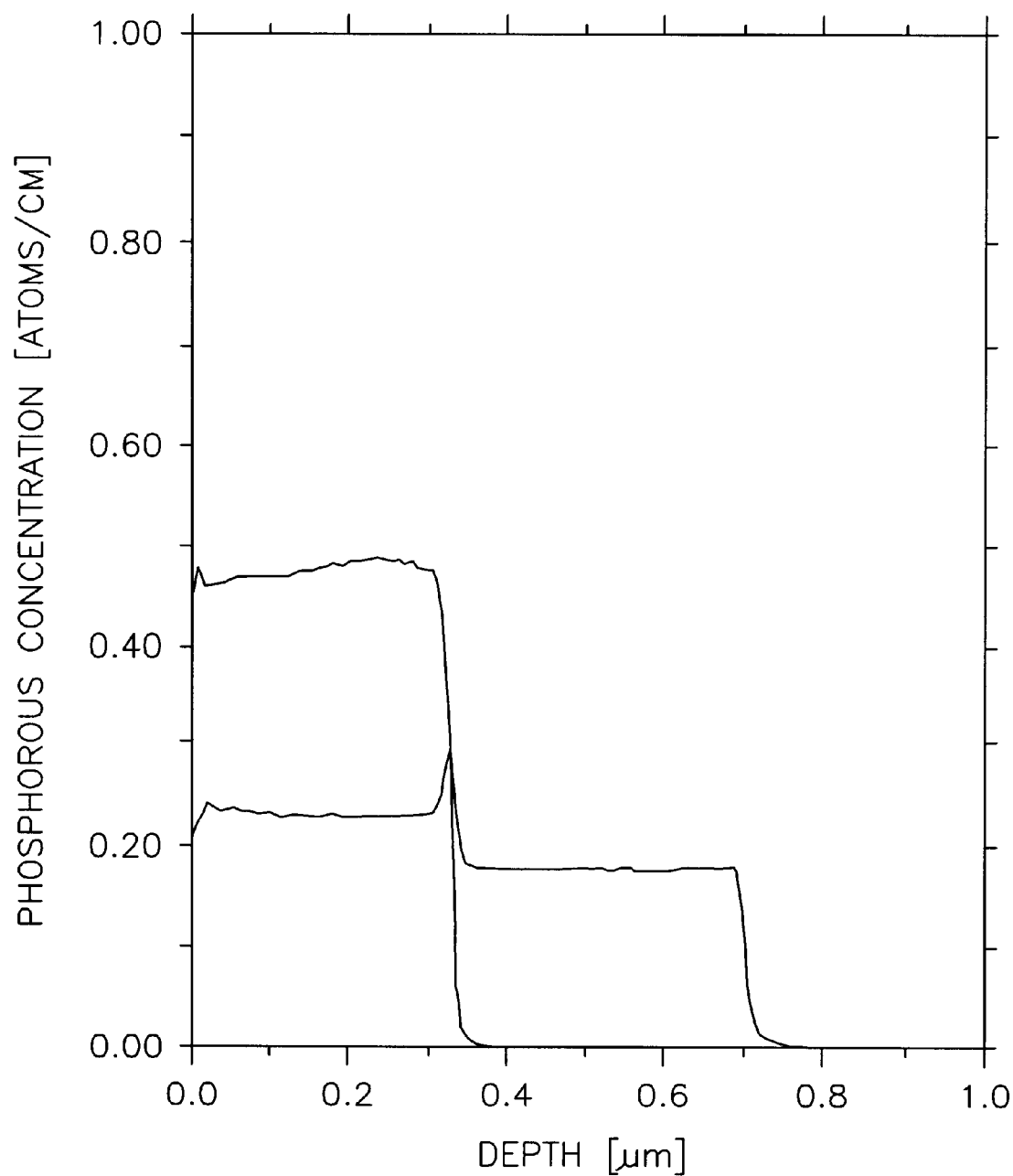
FIG. 7B shows a SIMS profile of a control wafer with a spike in phosphorous concentration.

Alternately, SIMS analysis may be used to detect striations. During SIMS analysis, the oxygen beam penetrates and makes a hole through the thickness of the film stack on the control wafer (15) to detect the phosphorous concentration through the thickness of the layers on the control wafer (15). If there is a localized area of phosphorus within the control wafer (15), it is easily detected within the PSG layer (16) of the control wafer (15) of the current invention. Striations are detected as spikes or localized increases in the phosphorous concentration in the SIMS concentration profile. FIG. 7A shows a SIMS profile of a control wafer (15) with a constant phosphorous concentration level. FIG. 7B shows a control wafer (15) with a spike in phosphorous concentration, indicating a striation. In addition to detecting striations, SIMS analysis also makes it possible for faster determination of other depth dopant variations, such as interface dopant variations. By having accurate regularly tested standards available, dopant depth concentration varying from the standards can be monitored and detected before they become scrap issues at the end of the production line.

If a striation is detected in the control wafer (15) by the analytical tools of SEM or SIMS, the PSG processing tools are shut down for repair or hardware replacement in step (130). For example, any clogged liquid phosphorus injectors would be replaced with new liquid phosphorus injectors. After the processing problem is corrected, fabrication of the product wafers continues in step (140). Alternatively, to double check that striations are no longer present using the repaired or new hardware, another control wafer (15) is manufactured in step (100) to retest for the presence of striations. If there are no striations found in the control wafer (15), fabrication of the product wafers continues in step (140).

By consistently supplying control wafers (15) containing striations when there is a processing problem during deposition of the PSG layer (16), this method reliably detects striations in the control wafers (15). Using the method of the invention, the number of product wafers produced that contain striations is dramatically decreased. Since the striations cannot be removed from product wafers, any affected product must be discarded. Therefore, detecting striations during processing instead of at the end of processing during final current testing is a substantial improvement by eliminating wasted processing, thereby saving time and money. In addition, by utilizing the new control wafer (15), the defect can be detected prior to the generation of any product wafers thereby reducing scrap.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A method of analyzing a control wafer to determine striations on separately processed product wafers comprising:
   a) producing the control wafer for analyzing striations formed on at least one of the product wafers having an average product PSG thickness, wherein the control wafer comprises:
      i) a substrate layer;
      ii) an USG layer deposited directly above the substrate layer;
      iii) a PSG layer deposited directly on top of the USG layer, the PSG layer having a control thickness greater than about 2500 Å and greater than the average product PSG thickness; and
      iv) a boron phosphorus silicate glass (BPSG) layer deposited directly on top of the PSG layer; and
   b) analyzing the control wafer to detect if a striation is present in the control wafer.

2. The method of claim 1 further comprising fixing a processing problem for deposition of the PSG layer if the striation is detected.

3. The method of claim 2 wherein fixing a processing problem comprises replacing at least one clogged liquid phosphorus injector.

4. The method of claim 1 wherein the PSG layer has a control thickness in the range from about 3000 Å to about 4000 Å.

5. The method of claim 1 wherein analyzing the control wafer comprises using scanning electron microscopy.

6. The method of claim 1 wherein analyzing the control wafer comprises using secondary ion mass spectrometry (SIMS).

7. The method of claim 5 wherein a total thickness of the control wafer is less than the detection limit of SIMS.

8. The method of claim 1 wherein a total thickness of the control wafer is equivalent to a total thickness of a product wafer.

9. A product wafer produced using the method of claim 1.

10. A method for determining striations on a product wafer comprising:
    proving a control wafer;
    forming a stack of films on the control wafer, the stack including a PSG layer, the PSG layer having a control thickness greater than about 2500 Å;
    analyzing the control wafer to detect if a striation is present in the control wafer;
    providing a product wafer and forming the stack of films on the product wafer, the PSG layer on the product wafer having a product thickness being less than the control thickness; and
    adjusting processing settings used to form the PSG layer on the product wafer based on the analyzing.

* * * * *